US005783866A

United States Patent [19]
Lee et al.

[11] Patent Number: 5,783,866
[45] Date of Patent: Jul. 21, 1998

[54] LOW COST BALL GRID ARRAY DEVICE AND METHOD OF MANUFACTURE THEREOF

[75] Inventors: Shaw Wei Lee, Cupertino; Hem P. Takiar, Fremont; Ranjan J. Mathew; Hee Jhin Kim, both of San Jose, all of Calif.

[73] Assignee: National Semiconductor Corporation, Santa Clara, Calif.

[21] Appl. No.: 649,395

[22] Filed: May 17, 1996

[51] Int. Cl.$^6$ .......... H01L 23/48; H01L 23/52; H01L 29/40; H01L 23/04

[52] U.S. Cl. .......... 257/780; 257/697; 257/738; 257/698; 438/613

[58] Field of Search .......... 257/780, 697, 257/779, 774, 778, 737, 738, 698; 361/813; 438/613

[56] References Cited

U.S. PATENT DOCUMENTS 4,082,394  4/1978  Gednoy et al. .......... 257/697
4,322,778  3/1982  Barbour et al. .......... 257/697
5,569,960  10/1996  Kumazawa et al. .......... 257/738

FOREIGN PATENT DOCUMENTS 5-144995  6/1993  Japan .......... 257/697

Primary Examiner—Mahshid D. Saadat
Assistant Examiner—Jhihan B. Clark
Attorney, Agent, or Firm—Skjerven, Morrill, MacPherson, Franklin & Friel; Edward C. Kwok

[57] ABSTRACT

A panel of, for example, bismaleimide triazine (BT) or ceramic ($Al_2O_3$) is chosen in size to be substantially filled with and taken up by end-result ball grid array (BGA) devices. The end-result devices are positioned closely together and take up substantially the entire area of the initial panel. Structural weakening is provided at appropriate places in the panel to allow the devices to be readily singulated.

9 Claims, 4 Drawing Sheets

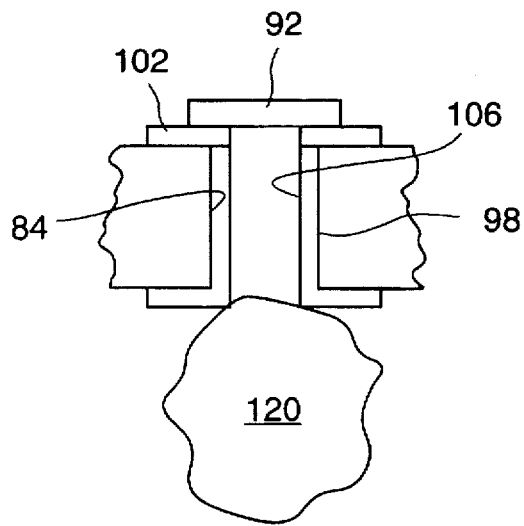
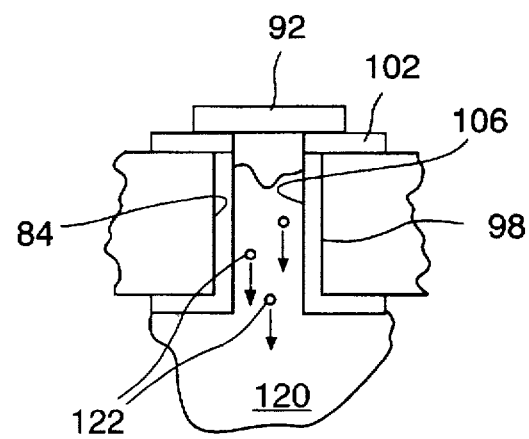
FIG. 12        FIG. 13
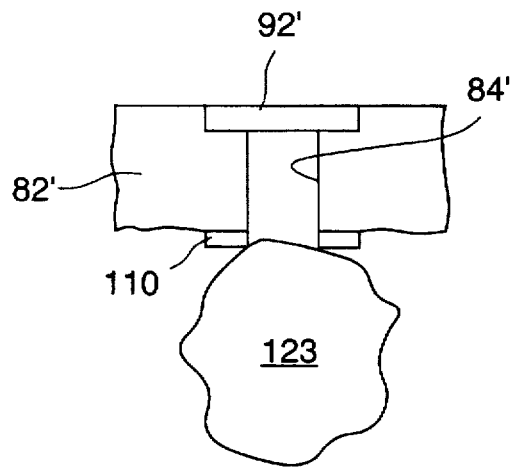
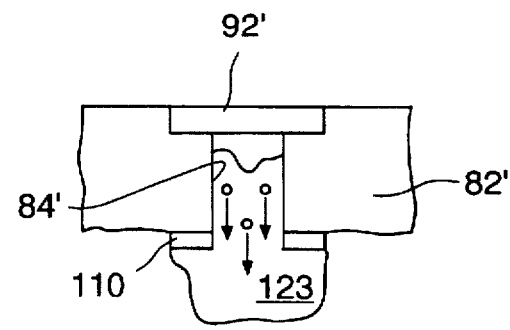
FIG. 14        FIG. 15

5,783,866

LOW COST BALL GRID ARRAY DEVICE AND METHOD OF MANUFACTURE THEREOF

FIELD OF THE INVENTION

This invention relates to ball grid array (BGA) devices and methods of fabrication thereof, and more particularly to a low cost structure adaptable to low input/output count devices.

BACKGROUND OF THE INVENTION

The publication BALL GRID ARRAY TECHNOLOGY, John H. Lau, published by McGraw-Hill, Inc., 1995, describes the growing popularity of ball grid array (BGA) technology, indicating the many advantages over, for example, pin grid array (PGA) technology as follows: reduced coplanarity problems (no leads); reduced placement problems (self-centering); reduced paste printing problems; reduced handling issues (no damaged leads); lower profile (smaller size); better electrical performance; better thermal performance; better package yield; better board assembly yield; higher interconnect density; cavity-up or -down options; multilayer interconnect options; higher number of inputs/outputs (I/Os) for a given foot-print; shorter wire bonds; easier to extend to multichip modules; and faster design-to-production cycle time.

In a typical plastic ball grid array device (PBGA) 10 (FIG. 2), a printed circuit board (PCB) such as bismaleimide triazine (BT) resin or ceramic ($Al_2O_3$) is used as a substrate 12. A silicon integrated circuit (IC) chip is provided on one side of such a substrate 12, with solder balls on the opposite side thereof, and with a molding compound 14 encapsulating the IC chip.

Electrical connection is made from the chip to the solder balls by means of wire bonding of flip chip connecting the chip to conductors on the surface of the substrate, from the conductors to traces and then through vias to the opposite side of the substrate on which other traces are provided, and then to the solder balls.

Up to the present time, BGA technology has been implemented in production mainly in high I/O application. For example, current BGA devices widely available in the semiconductor industry have 119, 169, 225, 256, 313, 352, 420 or 625 balls. Although devices with a lower number of I/O's make up the great bulk of the semiconductor product line at present, producing such lower number I/O devices in EGA technology has proven to be expensive. If BT is used, a large part of this expense, i.e., for example perhaps 50% of the cost of materials of the entire device 10, is tied up in the BT substrate 12.

Typically, BT or ceramic is provided in single-element form 16 (FIG. 1) with dimensions of, for example, 45 mm by 187.5 mm. It then falls to the manufacturer of BGA devices to lay out such devices in an attempt to use the maximum area of the element 16. Then, the completed devices 10 are singulated (indicated by the dotted lines 17 on the element 16), with excess material cut away, to result in individual BGA devices 10 (FIG. 2).

It will readily be seen that a substantial part of the element 16 is unused in the fabrication of devices 10, and is thus wasted. In fact, typically, in the current state of the industry, only 60 to 80% of the area of the element 16 is actually used in the fabrication of devices 10, while the rest is discarded.

As pointed out above, the material of element 16 is a significant part of the cost of the materials of the device. It is therefore of great interest to minimize that portion of the element which is not used in the actual fabrication of BGA devices, so that overall device cost can be reduced, in turn allowing the industry to move toward profitable production of devices of lower I/O count.

SUMMARY OF THE INVENTION

The present invention uses a panel of, for example, BT or ceramic, which is chosen in size to be substantially filled with and taken up by end-result BGA devices. The end-result devices are thus positioned closely together and take up substantially the entire area of the initial panel. The panel may include structural weakening at appropriate places to allow the devices to be separated readily from each other. The devices may be tested with the panel in its original form. Thus, the problem of waste of material in fabricating the devices is avoided.

DESCRIPTION OF THE DRAWINGS

FIGS. 12 and 13 show a method of forming the ball device of FIG. 10; and

FIGS. 14 and 15 show a method of forming the ball device of FIG. 11.

DESCRIPTION OF THE PREFERRED EMBODIMENTS

Figure 1:
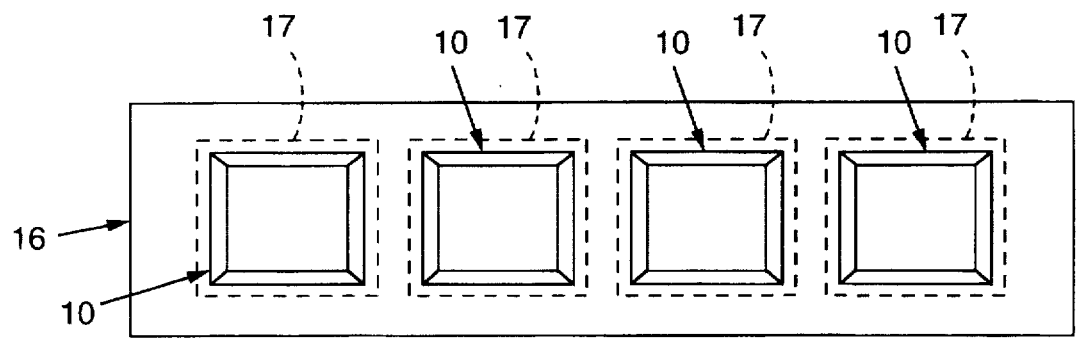
FIG. 1 is a plan view of a standard size substrate element having BGA devices formed thereon.
Figure 2:
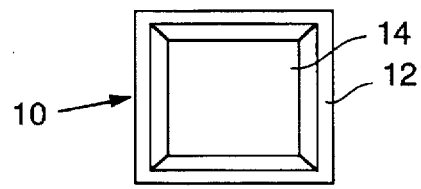
FIG. 2 is a plan view of an individual singulated BGA device of FIG. 1.
Figure 3:
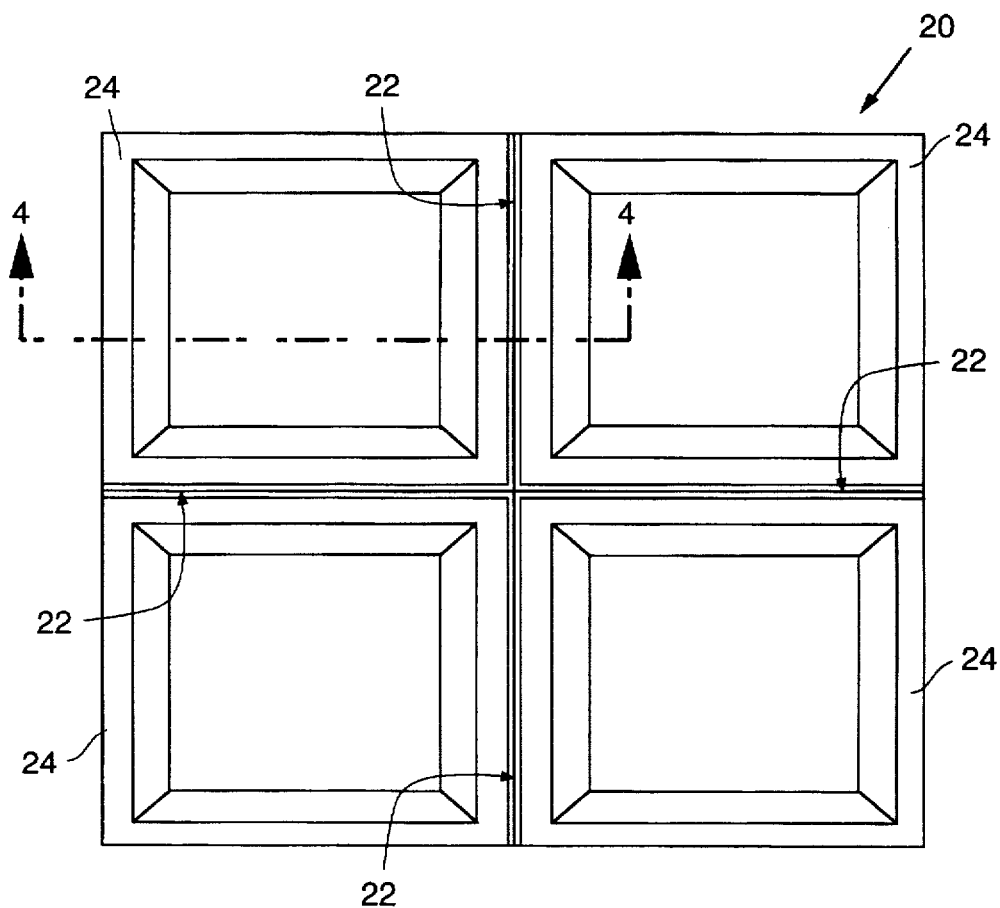
FIG. 3 is a plan view of a preferred embodiment of the substrate panel of the invention, including BGA devices formed thereon.
Figure 4:
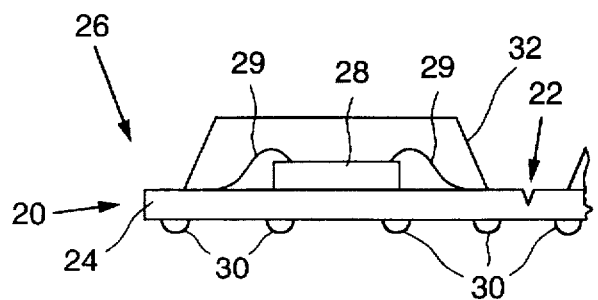
FIG. 4 is a sectional view taken along the line 4—4 of FIG. 3, showing a device having balls and an integrated circuit chip on opposite sides of the substrate.

With reference to FIG. 3, shown therein is a panel (for example, BT or ceramic ($Al_2O_3$)) of substrate material 20 in accordance with the present invention. The panel 20 defines V-shaped grooves 22 dividing the panel 20 into segments 24 of substantially the same size which will eventually become the substrates of individual BGA devices 26. With reference to FIG. 4, which is a sectional view of a portion of the structure of FIG. 3, a substrate 24 of the panel 20 is shown, having thereon an integrated circuit chip 28 and wire bonds 29 which, through appropriate conductive traces and vias, communicate with the solder balls 30 on the substrate 24, which are on the side thereof opposite the chip 28. The chip 28 and wire bonds 29 are, of course, covered by encapsulating material 32 as is well known. Each of the segments 24 thus has associated therewith structure which will provide individual BGA devices 26 similar to that shown in FIG. 2.

The BGA devices 26 may be readily separated from each other by breaking the panel 20 along the V-grooves 22, the panel 20 being structurally weakened where chosen by placement of such V-grooves 22. It will be readily understood that the panel 20 could be weakened by other means, for example, passages through the panel 20.

By sizing each segment 24 to correspond substantially to the dimensions of the final BGA device 6, and providing a panel 20 whose dimensions are defined by a plurality of such substrates 24, it is assured that substantially the entire panel 20, a relatively expensive part of the resulting device 26, is used in the fabrication of BGA devices. That is, once the BGA devices 26 are singulated, i.e., each is separated from the others, no waste product of substrate material remains, as is the case in the prior art.

While a panel made up of four substrates 24 is shown in FIG. 3, it will readily be seen that a much larger number of substrates can be used to define the panel, in furtherance of the present invention. In addition, a relatively simple BGA type device is shown in FIG. 4, using, for example, 4×4=16 balls. However, again, it is to be pointed out that the features of the present invention are readily applicable to a BGA device of any size.

Figure 5:
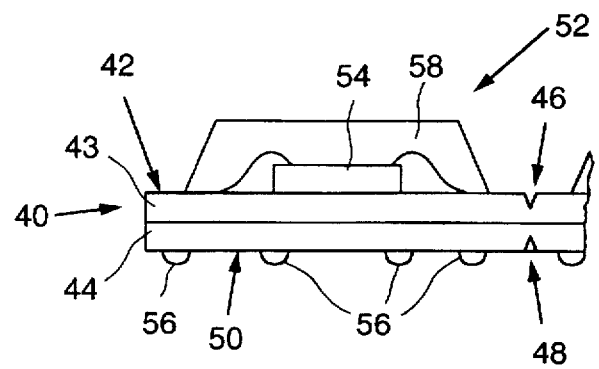
FIG. 5 is a sectional view of a device similar to that shown in FIG. 4, but using a pair of stacked substrates.

FIG. 5 is a sectional view similar to that of FIG. 4, but of another embodiment of the BGA device 40. As shown therein, the panel 42 in this case is made up of back to back panels 43, 44, each defining V-grooves 46, 48. The V-grooves 46, 48 define individual 2-layered substrates 50 of a BGA device 52, as shown in FIG. 5. The chip 54 is disposed on one side of the substrate 50, while the balls 56 of the BGA devices 52 are on the opposite side of the substrate 50 as shown. In this case, vias and additional layers of traces may be provided, with the chips 54 encapsulated with molding material 58 as previously described. Again, the BGA devices 52 are readily singulated, i.e., readily separated from each other by means of the breaking of the panel 42 along the V-grooves 46, 48.

Figure 6:
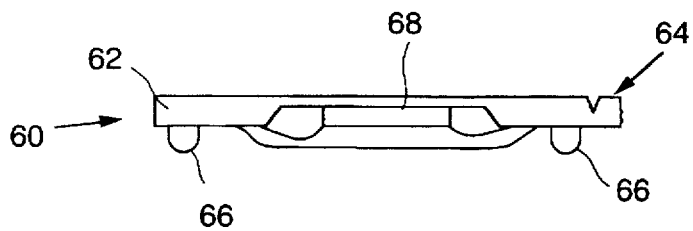
FIG. 6 is a sectional view of a device having the balls and integrated circuit chip on the same side of the substrate.

FIG. 6 is a sectional view of another BGA device 60 using a substrate 62 which again is a portion of a panel 64 of substrate material. In this case, however, the balls 66 and semiconductor chip 68 are on the same side of the substrate 62.

Figure 7:
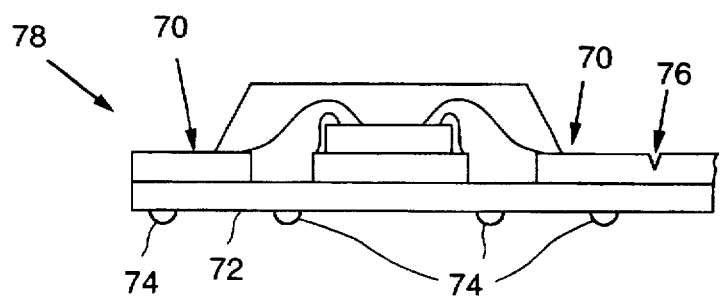
FIG. 7 is a sectional view of a device including a substrate and a lead frame.

FIG. 7 shows the use of lead frames 70 as segments of the panel, the lead frames 70 being disposed on a solder mask 72 with solder balls 74 thereadjacent, again with appropriate V-grooves 76 for the singulation of the individual devices 78.

Figure 8:
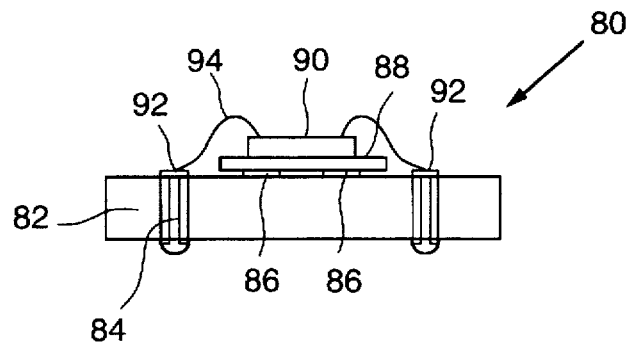
FIG. 8 is a sectional view of a device showing connection of balls to the integrated circuit chip.
Figure 9:
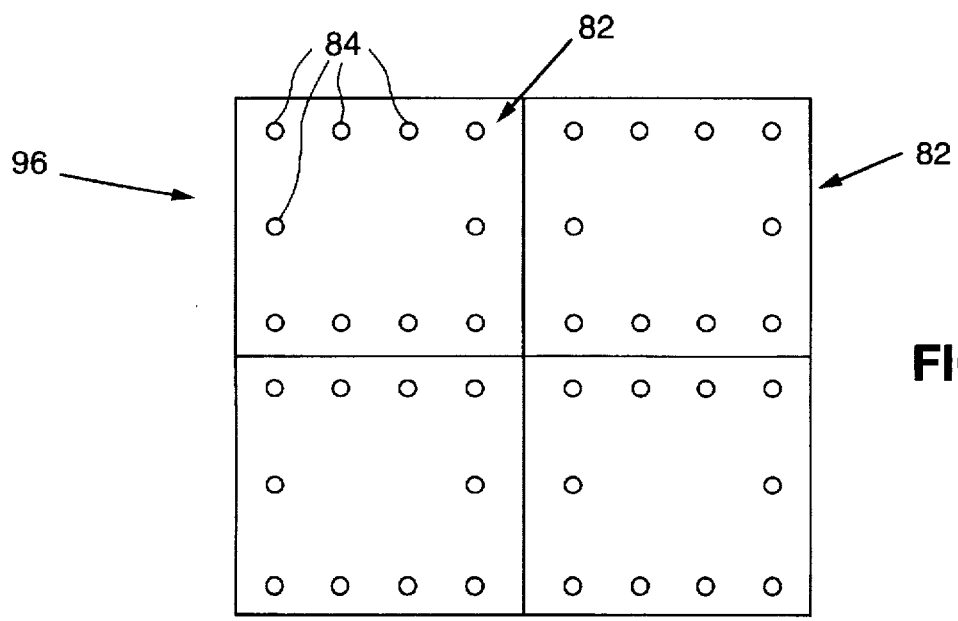
FIG. 9 is a plan view of a panel made up of bodies of the body of FIG. 8.

FIG. 8 is a cross-sectional view of another embodiment of a BGA device 80. As shown therein, and also with reference to FIG. 9, a base 82 is provided, having a plurality of passages 84 therethrough, from one side to the other. The base 82 takes the place of a lead frame. Conductive traces 86 are provided on one side of the base, with dielectric 88 provided thereover and a chip 90 disposed on the dielectric 88. Metalization caps 92 lie over the respective passages. Wire bonding 94 connects the chip 90 with the metalization caps 92. The passages 84 may be made conductive either by conventional through-hole plating or by filling the passages with conductive paste. The base 82 again is part of a large panel 96 (FIG. 9) which is defined and dimensioned by the size of the individual bases 82.

Figure 10:
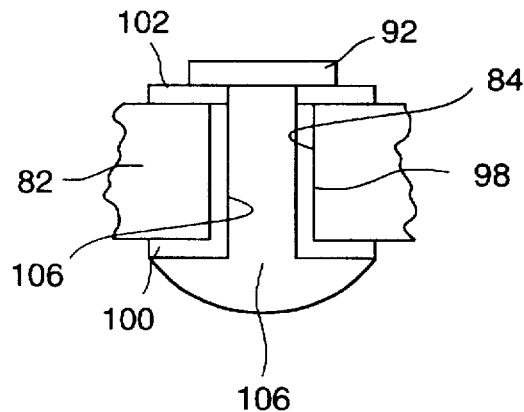
FIG. 10 is a detailed view of an embodiment of the ball structure of the device of FIG. 8.

An enlarged sectional view of a filled passage of FIG. 8 is shown in FIG. 10. As shown in such FIG. 10, a conductive liner 98 is included in the passage 84, having a radial land portion 100 which extends along a surface of the base 82. A conductive ring structure 102 is disposed on the opposite side of the base 82, and on such conductive ring structure 102 is disposed the metalization cap 92. Solder 104 fills the bore 106 of the liner 98 and is disposed on the outer surface of the radial land portion 100 of the liner 98, and extends into contact with the metalization cap 92. The bases 82 may be prebumped in this manner prior to any further assembly of a BGA.

Figure 11:
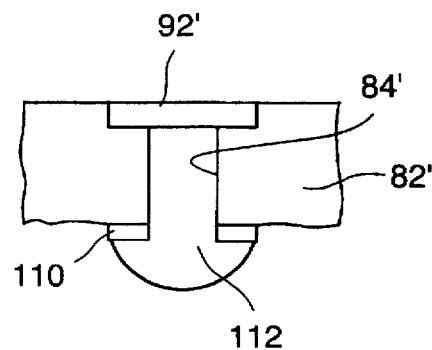
FIG. 11 is an alternative ball structure of the device of FIG. 8.

With regard to FIG. 11, which is the sectional similar to FIG. 10, the liner is absent but a radial land portion 110 is included. In this situation, the metalization cap 92' is embedded in the base 82', and again solder 112 extends through the passage 84' of the base 82' and into contact with the metalization cap 92', and, on the side of the base 82' opposite the metalization cap 92', defines a solder bump.

The solder fill and bumps of FIG. 10 may be formed in the manner indicated in FIG. 12 and 13, wherein a body of solid solder 120 is provided adjacent one end of the passage 84 (i.e., adjacent one end of the base 106 of the liner 98) and is then melted, the passage 84 and liner bore 106 being small enough so that capillary action acts to draw the melted solder into the bore 106 and into contact with the metalization cap 92. Air bubbles 122 move in the opposite direction as the solder fills the bore 106. Similarly, the fill and bump of FIG. 11 (without any liner) may be formed by melting a solid body of solder 123 at one end of the passage 84', capillary action drawing the melted solder directly into the passage 84' (FIGS. 14 and 15) and into contact with the metalization cap 92'.

Then, after traces and the oxide layer are provided, the chip is put into place and wire bonded to the bondable metalization caps, which are in contact with the conductive solder in the passages. The overcoating can be screened on or encapsulated with conventional transfer molding methods or cast to the desired thickness in an appropriate non-stick mold. The preformed bumps are designed to withstand molding/coating conditions and temperatures. The molds may be designed with relief for the preformed bumps.

The dielectric, insulator and substrate surface features can be chosen to maximize adhesion of mold compound to the substrate. After application and adhering of the overcoat, the substrate is singulated by sawing between the preformed bumps. The assembly is pretestable prior to singulation, i.e., by contacting the preformed bumps.

A space saving is achieved as compared to prior systems, since connections are made through the base to the bumps, rather than peripherally about the base.

What we claim is:

1. A ball grid array structure comprising:
   a panel forming a plurality of substrates, the substrates defining substantially the entire area of the panel;
   a plurality of conductive traces provided on each of said substrates;
   an insulative base provided on each of said substrates over a portion of said conductive traces, said insulative base (i) having a first side adapted for accommodating a semiconductor die and (ii) being provided conductive passages from said first side of said base to another side of said base, and
   a plurality of conductive balls associated with each substrate, one or more of said conductive balls being electrically coupled via said electrical traces to said conductive passages.

2. The structure of claim 1 wherein defined on the panel are a plurality of structurally weakened portions between two of the substrates.

3. The structure of claim 1 and further comprising a plurality of semiconductor devices, each associated with a substrate.

4. The structure of claim 1 and further comprising a second panel provided adjacent the first-mentioned panel and on the side of the panel opposite the side of the panel on which said conductive balls is associated.

5. The structure of claim 3 wherein the conductive balls and the semiconductor device associated with one of the substrates are provided on the same side of the panel.

6. The semiconductor device of claim 3 wherein the conductive balls and the semiconductor device associated with one of the substrates are on opposite sides of the panel.

7. A ball grid array structure comprising:

a substrate defining a conductive passage therethrough;

a conductor on one side of the substrate, extending at least partially over and contacting said conductive passage;

an insulative base provided over a portion of the conductor on said side of the substrate, the insulative base having a first side adapted for accommodating a semicoductor die, and having a conductive passage electrically coupling said first side to another side of the insulative base;

and a conductive bump electrically coupled to the conductive passage of the insulative base via the conductive passage of the substrate and the conductor.

8. The ball grid array structure of claim 7 wherein the conductive passage of the substrate and the conductive passage of the insulative base are filled with solder.

9. The ball grid array structure of claim 7 and further comprising a tubular conductor in said conductive passage of the substrate.

* * * * *

UNITED STATES PATENT AND TRADEMARK OFFICE
CERTIFICATE OF CORRECTION

PATENT NO.    : 5,783,866
ISSUE DATE    : July 21, 1998
INVENTOR(S)   : Lee, Shaw W.; Takiar, Hem P.; Mathew, Ranjan J.; Kim, Hee J.

It is certified that error appears in the above-identified patent and that said Letters Patent is hereby corrected as shown below:

Col. 3, line 10, delete "device 6" and insert --device 26--.

Signed and Sealed this

Fifteenth Day of June, 1999

Attest:

Q. TODD DICKINSON

*Attesting Officer*    Acting Commissioner of Patents and Trademarks